(12) United States Patent
Furuta

(10) Patent No.: US 8,212,596 B2
(45) Date of Patent: Jul. 3, 2012

(54) PLL CIRCUIT

(75) Inventor: Atsushi Furuta, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 58 days.

(21) Appl. No.: 12/662,042

(22) Filed: Mar. 29, 2010

(65) Prior Publication Data

US 2010/0264964 A1    Oct. 21, 2010

(30) Foreign Application Priority Data

Apr. 16, 2009   (JP) .................................. 2009-100024

(51) Int. Cl.
 *H03L 7/06* (2006.01)
(52) U.S. Cl. ........................................ 327/156; 327/147
(58) Field of Classification Search .................. 327/147, 327/156
 See application file for complete search history.

(56) References Cited

U.S. PATENT DOCUMENTS

| | | | | |
|---|---|---|---|---|
| 5,315,623 | A * | 5/1994 | Kuo ............................... | 375/376 |
| 5,537,448 | A * | 7/1996 | Schwarz et al. ............... | 375/376 |
| 5,821,789 | A * | 10/1998 | Lee ................................ | 327/156 |
| 6,538,518 | B1 * | 3/2003 | Chengson ....................... | 331/17 |
| 6,816,712 | B2 * | 11/2004 | Otaka et al. ..................... | 455/83 |
| 7,019,571 | B2 * | 3/2006 | Lim ................................ | 327/157 |
| 7,203,014 | B2 * | 4/2007 | Kuroda et al. .................. | 360/48 |
| 7,782,144 | B2 * | 8/2010 | Hasegawa ....................... | 331/17 |
| 7,812,677 | B2 * | 10/2010 | Wyatt ............................. | 331/17 |
| 7,948,286 | B2 * | 5/2011 | Yen et al. ....................... | 327/157 |
| 8,022,774 | B2 * | 9/2011 | Ueno et al. ..................... | 331/17 |
| 2004/0042107 | A1 * | 3/2004 | Kuroda et al. .................. | 360/51 |
| 2007/0111673 | A1 * | 5/2007 | Otaka et al. ..................... | 455/76 |
| 2008/0042759 | A1 * | 2/2008 | Watanabe ....................... | 331/17 |
| 2009/0122912 | A1 * | 5/2009 | Dounaev et al. ............... | 375/298 |
| 2009/0140816 | A1 * | 6/2009 | Wyatt ............................. | 331/11 |
| 2010/0026405 | A1 * | 2/2010 | Ueno et al. ..................... | 331/36 C |
| 2010/0026406 | A1 * | 2/2010 | Fujiwara et al. ............... | 331/36 R |
| 2010/0253402 | A1 * | 10/2010 | Awata ............................ | 327/156 |
| 2010/0253403 | A1 * | 10/2010 | Kantor et al. .................. | 327/157 |
| 2010/0264964 | A1 * | 10/2010 | Furuta ............................ | 327/157 |
| 2011/0080199 | A1 * | 4/2011 | Yen et al. ....................... | 327/157 |
| 2011/0216864 | A1 * | 9/2011 | Kim et al. ...................... | 375/371 |

FOREIGN PATENT DOCUMENTS

JP       3840468       8/2006

* cited by examiner

*Primary Examiner* — Lincoln Donovan
*Assistant Examiner* — Adam Houston
(74) *Attorney, Agent, or Firm* — McGinn IP Law Group, PLLC

(57) ABSTRACT

There is provided a PLL circuit including a first loop filter and a second loop filter, which includes a current signal generation circuit that includes a first output driver that generates a first current signal to be output to the first loop filter and a second output driver that generates a second current signal to be output to the second loop filter, and a control circuit that selects which of the first output driver and the second output driver is to be activated.

20 Claims, 10 Drawing Sheets

|     |     | DECODER OUTPUT | | | |
| --- | --- | --- | --- | --- | --- |
|     |     | UP1 | DN1 | UP2 | DN2 |
| SEL | 0 | UP | DN | 0 | 0 |
|     | 1 | 0 | 0 | UP | DN |

Fig. 3

// PLL CIRCUIT

INCORPORATION BY REFERENCE

This application is based upon and claims the benefit of priority from Japanese patent application No. 2009-100024, filed on Apr. 16, 2009, the disclosure of which is incorporated herein in its entirety by reference.

BACKGROUND

1. Field of the Invention

The present invention relates to a phase-locked loop (PLL) circuit.

2. Description of Related Art

Recently, a PLL circuit has been used on chip for clock signal distribution in an application-specific integrated circuit (ASIC), a microcomputer or the like used in various devices. There is a large variety of characteristics required for a PLL circuit. For example, a PLL circuit including a loop filter with a high cut-off frequency is used when it is intended to shorten lock-up time, and a PLL circuit including a loop filter with a low cut-off frequency is used when it is intended to suppress jitter of an input clock from being transferred to an output clock. In this manner, it is desired to implement a PLL circuit that generates a clock signal in compliance with the characteristics required according to circumstances.

FIG. 6 shows a block configuration of a PLL circuit 1 that includes a loop filter according to prior art disclosed in Japanese Patent No. 3840468. Referring to FIG. 6, the PLL circuit 1 includes a phase frequency detector 10, switch circuits SW10 and SW20, loop filters FIL10 and FIL20, a voltage control oscillator 20, a frequency divider 30, and a control circuit 40.

The phase frequency detector 10 compares the phases of a clock signal input from an input terminal IN1 and a clock signal output from the frequency divider 30. The phase frequency detector 10 then outputs a current signal VC corresponding to a phase difference between the clock signals to the loop filter FIL10 or FIL20 via the switch circuit SW10.

The loop filters FIL10 and FIL20 have different cut-off frequencies. The loop filters FIL10 and FIL20 convert the current signal output from the phase frequency detector 10 to a voltage signal. The loop filters FIL10 and FIL20 then output the voltage signal VCS to the voltage control oscillator 20 via the switch circuit SW20. It is assumed in this example that the cut-off frequency of the loop filter FIL10 is lower than the cut-off frequency of the loop filter FIL20.

The voltage control oscillator 20 generates a clock signal OUT with a frequency corresponding to the voltage signal VCS output from the loop filter FIL10 or FIL20 and outputs it to an output terminal OUT.

The frequency divider 30 divides the frequency of the clock signal OUT output from the voltage control oscillator 20 by a predetermined value. The frequency divider 30 then outputs a feedback clock signal FD after frequency division to the phase frequency detector 10.

One end of a variable capacitor C1 is connected to the output terminal OUT, and the other end is connected to a ground terminal GND. The variable capacitor C1 is a capacitor whose capacitance can be changed, and the capacitance is changed in response to control by the control circuit 40.

The control circuit 40 controls the switch circuits SW10 and SW20 based on a signal input from an input terminal IN2 and selects one of the loop filters FIL10 and FIL20. By selecting either the loop filter FIL10 or FIL20 to be connected, the PLL circuit 1 can operate With the characteristics required in a system. For example, when selecting the loop filter FIL20 with a high cut-off frequency, it is possible to shorten the lock-up time. On the other hand, when selecting the loop filter FIL10 with a low cut-off frequency, it is possible to suppress jitter of a signal input to the PLL circuit 1 from being transferred to an output signal.

FIG. 7 is an exemplary block diagram of the phase frequency detector 10 used in the PLL circuit 1. Referring to FIG. 7, the phase frequency detector 10 includes a phase comparison circuit 11 and a charge pump 12. The phase comparison circuit 11 receives a clock signal FR from the input terminal IN1 and a feedback signal FD and outputs pulse signals UP and DN. The charge pump 12 receives the pulse signals UP and DN and outputs a current signal VC.

FIG. 8 shows an exemplary circuit configuration of the charge pump 12. The charge pump 12 includes a current generation unit 13 and an output driver unit 14. The current generation unit 13 includes a first current source circuit made up of a current source IS11 and an NMOS transistor MN11 and a second current source circuit made up of a current source IS21 and a PMOS transistor MP21. The output driver unit 14 includes a current output PMOS transistor MP23, a current output NMOS transistor MN13, switch circuits SW11 and SW21, a pull-up PMOS transistor MP22, and a pull-down NMOS transistor MN12. The on/off of the switch SW11 is controlled according to the pulse signal DN. By the switch SW11, the on/off of the current output NMOS transistor MN13 is controlled. The on/off of the switch SW21 is controlled according to the pulse signal UP. By the switch SW21, the on/off of the current output PMOS transistor MP23 is controlled, FIG. 9 is an exemplary block diagram of the voltage control oscillator 20 used in the PLL circuit 1. Referring to FIG. 9, the voltage control oscillator 20 includes a voltage-current conversion circuit 21 and a current control oscillator 22. The voltage-current conversion circuit 21 receives the voltage signal VCS and outputs a current signal IC to the current control oscillator 22. The current control oscillator 22 outputs a clock signal OUT with a frequency corresponding to the current signal IC.

FIG. 10 shows an exemplary circuit configuration of the voltage-current conversion circuit 21. The voltage-current conversion circuit 21 includes an input NMOS transistor MN31, a pull-down NMOS transistor MN32, and a resistor R31. The input NMOS transistor MN31 receives the voltage signal VCS at its gate and outputs the current signal IC to its drain. The pull-down NMOS transistor MN32 supplies a ground voltage for turning off the input NMOS transistor MN31 to the gate of the input NMOS transistor MN31 upon receiving a standby signal at its gate.

The operation of the PLL circuit 1 according to prior art is described hereinbelow. If a signal input from the input terminal IN2 is configured so as to lock up the PLL circuit 1 at high speed, for example, the control circuit 40 controls the switch circuits SW10 and SW20 and selects the loop filter FIL20. The phase frequency detector 10 compares the phases of the signal FR input from the input terminal IN1 and the feedback clock signal FD output from the frequency divider 30. Then, the loop filter FIL20 converts the current signal VC corresponding to the phase difference to the voltage signal VCS. The voltage signal VCS is input to the voltage control oscillator 20; and the voltage control oscillator 20 outputs the clock signal OUT with a frequency corresponding to the voltage signal VCS. The frequency divider 30 divides the frequency of the clock signal OUT by a predetermined value and outputs the feedback signal FD to the phase frequency detector 10.

On the other hand, if a signal input from the input terminal IN2 is configured so as to suppress transfer of jitter of an input clock to the PLL circuit 1, for example, the control circuit 40 controls the switch circuits SW10 and SW20 and selects the loop filter FIL10. The phase frequency detector 10 compares the phases of the signal FR input from the input terminal IN1 and the feedback signal FD output from the frequency divider 30. Then, the loop filter FIL10 converts the current signal VC corresponding to the phase difference to the voltage signal VCS. The voltage signal VCS is input to the voltage control oscillator 20, and the voltage control oscillator 20 outputs the clock signal OUT with a frequency corresponding to the voltage signal VCS. The frequency divider 30 divides the frequency of the clock signal OUT and outputs the feedback signal FD to the phase frequency detector 10.

With use of the PLL circuit 1 as described above, when it is desirable to selectively use a PLL circuit with a different cut-off frequency in a semiconductor integrated circuit such as an ASIC, for example, it is possible to operate a PLL circuit with a desired cut-off frequency by switching loop filters with a switch circuit, without preparing a plurality of PLL circuits.

SUMMARY

As described above, in the PLL circuit 1, either one of the plurality of loop filters FIL10 and FIL20 is selected. The selection is made by controlling the switch circuits SW10 and SW20. Specifically, the output of the charge pump 12 is switched by the switch circuit SW10, and the input of the voltage-current conversion circuit 21 is switched by the switch circuit SW20. However, in the PLL circuit 1 having such a configuration, the switch circuit SW10 affects the input of the loop filter FIL10 or FIL20 and the switch circuit SW20 affects the output of the loop filter FIL10 or FIL20, each as a parasitic element. Specifically, the on-resistance and the parasitic capacitance of the switch circuits SW10 and SW20 are connected in series or parallel to a resistor and a capacitor constituting the loop filter FIL10 or FIL20, which causes variation in phase characteristics or frequency characteristics of the loop filter.

This affects the cut-off frequency or the like of the PLL circuit 1, and the on-resistance and the parasitic capacitance of the switch circuits SW10 and SW20 vary depending on a potential input to the switch circuits SW10 and SW20. Accordingly, when the cut-off frequency of the loop filter becomes lower than a desired value due to the parasitic element of the switch circuits SW10 and SW20, for example, the lock-up time of the PLL circuit 1 is lengthened, thus causing deterioration in characteristics.

A first exemplary aspect of the present invention is a PLL circuit including a first loop filter and a second loop filter, which includes a current signal generation circuit including a first output driver that generates a first current signal to be output to the first loop filter and a second output driver that generates a second current signal to be output to the second loop filter, and a control circuit that selects which of the first output driver and the second output driver is to be activated.

In the PLL circuit according to the exemplary aspect of the present invention, the current signal generation circuit includes the first output driver and the second output driver. The first output driver outputs the first current signal to the first loop filter, and the second output driver outputs the second current signal to the second loop filter. Activation of the first output driver and the second output driver is controlled by the control circuit. Therefore, the current signal is output only from either one of the first output driver or the second output driver that is activated by the control circuit. There is thus no need to place a switch circuit between the current signal generation circuit and the first and the second loop filters. The first and the second loop filters are thus not affected by a switch circuit as a parasitic element.

In a PLL circuit according to the exemplary aspect of the present invention, variation in phase characteristics or frequency characteristics of loop filters does not occur, thus preventing deterioration in characteristics.

BRIEF DESCRIPTION OF THE DRAWINGS

The above and other exemplary aspects, advantages and features will be more apparent from the following description of certain exemplary embodiments taken in conjunction with the accompanying drawings, in which:

FIG. 3 is a table to describe an operation of a decoder according to an exemplary embodiment;

DETAILED DESCRIPTION OF THE EXEMPLARY EMBODIMENTS

Exemplary Embodiment

Figure 1:
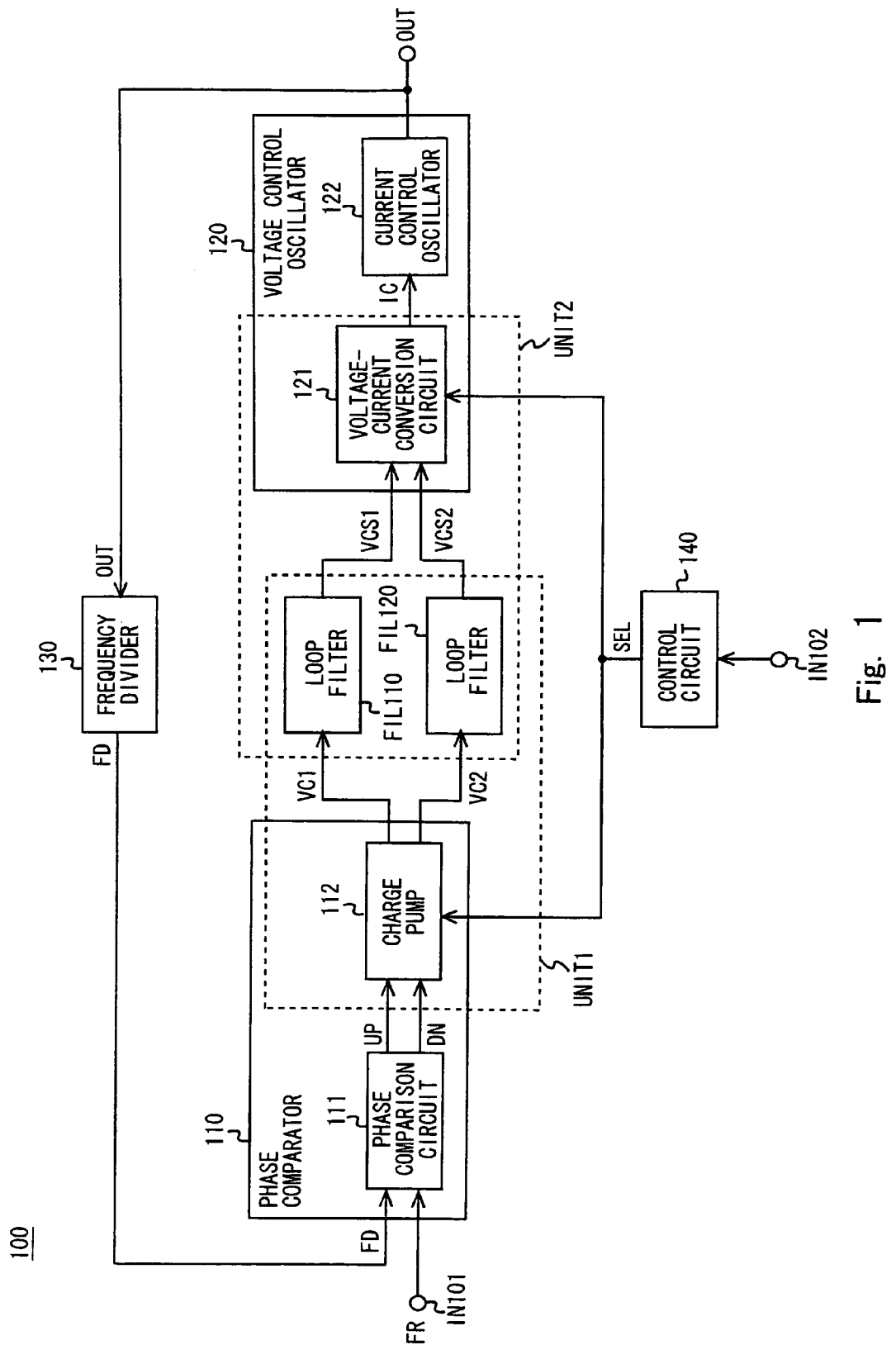
FIG. 1 is a block diagram of a PLL circuit according to an exemplary embodiment.

An exemplary embodiment of the present invention is described hereinafter in detail with reference to the drawings. FIG. 1 shows a configuration of a PLL circuit 100 according to the exemplary embodiment. Referring to FIG. 1, the PLL circuit 100 includes a phase frequency detector 110, loop filters FIL110 and FIL120, a voltage control oscillator 120, a frequency divider 130 and a control circuit 140.

The phase frequency detector 110 compares the phases of a reference clock signal FR input from an input terminal IN101 and a feedback clock signal FD, which is described later, output from the frequency divider 130. Then the phase frequency detector 110 generates a current signal VC1 (first current signal) or a current signal VC2 (second current signal) corresponding to a phase difference between the signals FR and FD. The phase frequency detector 110 then outputs the current signal VC1 to the loop filter FIL110 and outputs the current signal VC2 to the loop filter FIL120.

The phase frequency detector 110 includes a phase comparison circuit 111 and a charge pump 112. The phase comparison circuit 111 receives the reference clock signal FR and the feedback clock signal FD and outputs pulse signals UP and DN corresponding to a phase difference between the signals FR and FD.

The charge pump 112 receives a control signal SEL and the pulse signals UP and DN and outputs the current signal VC1 or VC2 according to the signals.

The loop filter FIL110 (first loop filter) and the loop filter FIL120 (second loop filter) have different cut-off frequencies. The loop filter FIL110 converts the current signal VC1 output from the phase frequency detector 110 to a voltage signal VCS1 (first voltage signal). The loop filter FIL120 converts the current signal VC2 output from the phase frequency detector 110 to a voltage signal VCS2 (second voltage signal). It is assumed in this example that the cut-off frequency of the loop filter FIL110 is lower than the cut-off frequency of the loop filter FIL120.

The voltage control oscillator 120 generates a clock signal OUT with a frequency corresponding to the voltage signal VCS1 or VCS2 output from the loop filter FIL110 or FIL120 and outputs it to an output terminal OUT. The voltage control oscillator 120 includes a voltage-current conversion circuit 121 and a current control oscillator 122. The voltage-current conversion circuit 121 receives the voltage signal VCS1 or VCS2 and outputs a current signal IC (current control signal) corresponding to the voltage signal VCS1 or VCS2 to the current control oscillator 122. The current control oscillator 122 outputs an output clock signal OUT with a frequency corresponding to the current signal IC.

The frequency divider 130 divides the frequency of the output clock signal OUT output from the voltage control oscillator 120 by a predetermined value. The frequency divider 130 then outputs the feedback clock signal FD after frequency division to the phase frequency detector 110.

The control circuit 140 outputs a selection control signal SEL to the charge pump 112 of the phase frequency detector 110 and the voltage-current conversion circuit 121 of the voltage control oscillator 120 based on a control signal input from an input terminal IN102. Either one of the loop filter FIL110 or FIL120 is selected according to a value of the selection control signal SEL, as described in detail later.

By selectively using the loop filter FIL110 or FIL120 as described above, the PLL circuit 100 can operate with the characteristics required in a system. For example, in the case of selecting the loop filter FIL120 with a high cut-off frequency, it is possible to shorten the lock-up time. On the other hand, in the case of selecting the loop filter FIL110 with a low cut-off frequency, it is possible to suppress jitter of a signal input to the PLL circuit 100 from being transferred to an output signal.

Figure 2:
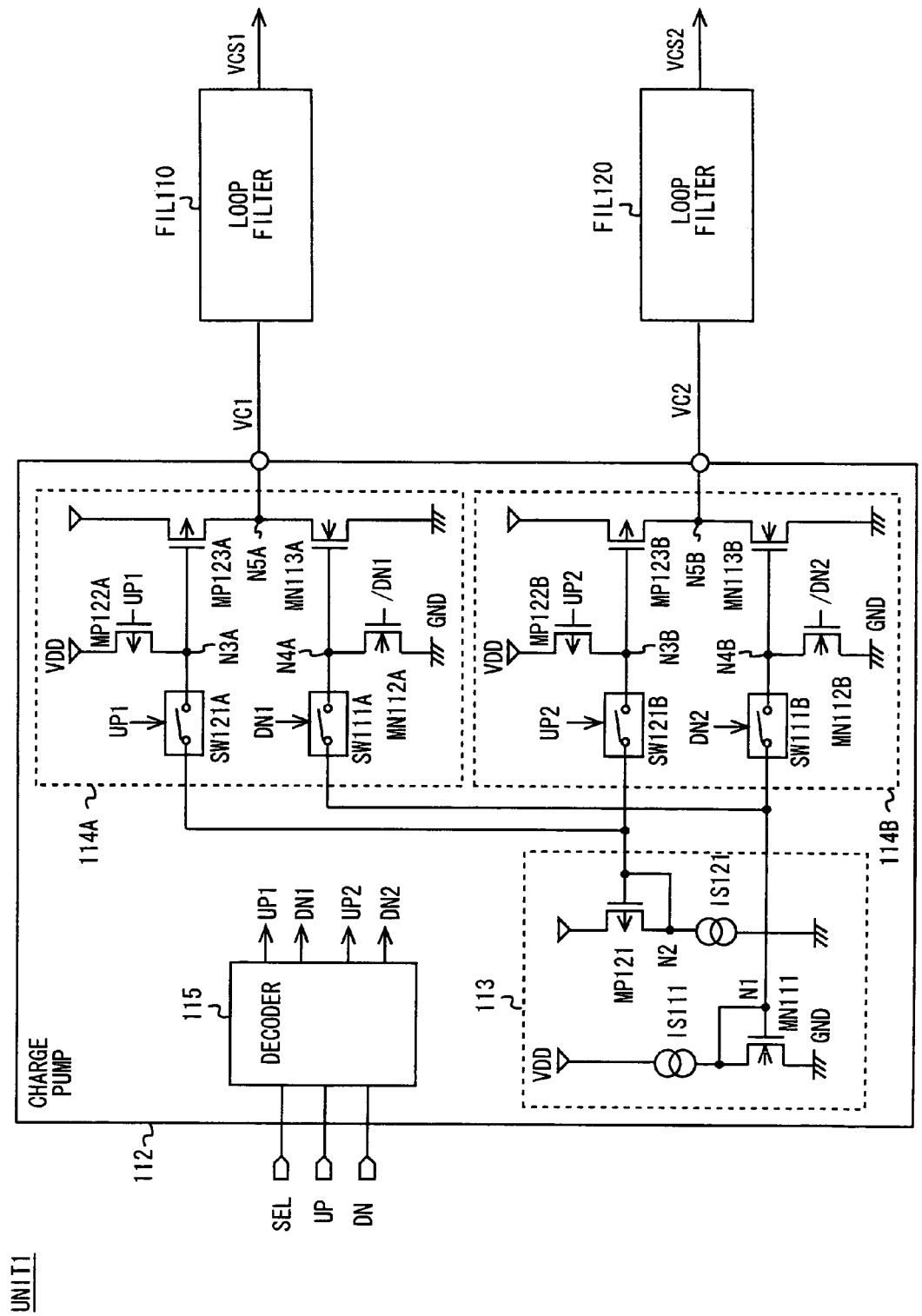
FIG. 2 shows configurations of loop filters and a charge pump according to an exemplary embodiment.

Hereinafter, the charge pump 112 and the loop filters FIL110 and FIL120 shown in FIG. 1 are described in detail, referred to as a circuit unit UNIT1. FIG. 2 shows a detailed circuit configuration of the circuit unit UNIT1. Referring to FIG. 2, the charge pump 112 (current signal generation circuit) includes a current generation unit 113, output driver units 114A and 114B and a decoder 115.

The current generation unit 113 includes current sources IS111 and IS121, an NMOS transistor MN111 and a PMOS transistor MP121. One end of the current source IS111 (first current source) is connected to a power supply terminal VDD, and the other end is connected to a node N1. The drain and the gate of the NMOS transistor MN111 (fifth transistor) are connected to the node N1, and the source is connected to a ground terminal GND. The source of the PMOS transistor MP121 (sixth transistor) is connected to the power supply terminal VDD, and the drain and the gate are connected to a node N2. One end of the current source IS121 (second current source) is connected to the node N2, and the other end is connected to the ground terminal GND.

The output driver unit 114A (first output driver) includes a current output PMOS transistor MP123A, a current output NMOS transistor MN113A, switch circuits SW111A and SW121A, a pull-up PMOS transistor MP122A, and a pull-down NMOS transistor MN112A.

The source of the current output PMOS transistor MP123A (first transistor) is connected to the power supply terminal VDD, the gate is connected to a node N3A, and the drain is connected to a node NSA. The drain of the current output NMOS transistor MN113A (second transistor) is connected to the node NSA, the gate is connected to a node N4A, and the source is connected to the ground terminal GND. The node NSA serves as an output terminal of the output driver unit 114A, and outputs the drain current of the current output PMOS transistor MP123A and the current output NMOS transistor MN113A as the current signal VC1. The loop filter FIL110 receives the current signal VC1 and outputs the voltage signal VCS1.

The source of the pull-up PMOS transistor MP122A is connected to the power supply terminal VDD, and the drain is connected to the node N3A. Further, a control signal UP1 is input to the gate of the pull-up PMOS transistor MP122A. The drain of the pull-down NMOS transistor MN112A is connected to the node N4A, and the source is connected to the ground terminal GND. Further, an inverted signal /DN1 of a control signal DN1 is input to the gate of the pull-down NMOS transistor MN112A.

One end of the switch circuit SW121A is connected to the node N2, and the other end is connected to the node N3A. The on/off of the switch circuit SW121A is controlled by a control signal UP1. For example, the switch circuit SW121A turns ON when the value of the control signal UP1 is "1" (High level), and turns OFF when the value of the control signal UP1 is "0" (Low level). One end of the switch circuit SW111A is connected to the node N1, and the other end is connected to the node N4A. The on/off of the switch circuit SW111A is controlled by a control signal DN1. For example, the switch circuit SW111A turns ON when the value of the control signal DN1 is "1" (High level), and turns OFF when the value of the control signal DN1 is "0" (Low level). The switch circuits SW111A and SW121A constitute a first switch circuit.

The output driver unit 114B (second output driver) includes a current output PMOS transistor MP123B, a current output NMOS transistor MN113B, switch circuits SW111B and SW121B, a pull-up PMOS transistor MP122B and a pull-down NMOS transistor MN112B.

The source of the current output PMOS transistor MP123B (third transistor) is connected to the power supply terminal VDD, the gate is connected to a node N3B, and the drain is connected to a node N5B. The drain of the current output NMOS transistor MN113B (fourth transistor) is connected to the node N5B, the gate is connected to a node N4B, and the source is connected to the ground terminal GND. The node N5B serves as an output terminal of the output driver unit 114B, and outputs the drain current of the current output PMOS transistor MP123B and the current output NMOS transistor MN113B as the current signal VC2. The loop filter FIL120 receives the current signal VC2 and outputs the voltage signal VCS2.

The source of the pull-up PMOS transistor MP122B is connected to the power supply terminal VDD, and the drain is connected to the node N3B. Further, a control signal UP2 is input to the gate of the pull-up PMOS transistor MP122B. The drain of the pull-down NMOS transistor MN112B is connected to the node N4B, and the source is connected to the ground terminal GND. Further, an inverted signal /DN2 of a control signal DN2 is input to the gate of the pull-down NMOS transistor MN112B.

One end of the switch circuit SW121B is connected to the node N2, and the other end is connected to the node N3B. The on/off of the switch circuit SW121B is controlled by a control signal UP2. For example, the switch circuit SW turns ON when the value of the control signal UP2 is "1" (High level), and turns OFF when the value of the control signal UP2 is "0" (Low level). One end of the switch circuit SW111B is connected to the node N1, and the other end is connected to the node N4B. The on/off of the switch circuit SW111B is controlled by a control signal DN2. For example, the switch circuit SW111B turns ON when the value of the control signal DN2 is "1" (High level), and turns OFF when the value of the control signal DN2 is "0" (Low level). The switch circuits SW111B and SW121B constitute a second switch circuit.

When the switch circuit SW111A is ON, the NMOS transistor MN111 of the current generation unit 113 and the current output NMOS transistor MN113A of the output driver unit 114A form a current mirror in which the NMOS transistor MN111 serves as an input transistor. Likewise, when the switch circuit SW111B is ON, the NMOS transistor MN111 of the current generation unit 113 and the current output NMOS transistor MN113B of the output driver unit 114B form a current mirror in which the NMOS transistor MN111 serves as an input transistor.

Further, when the switch circuit SW121A is ON, the PMOS transistor MP121 of the current generation unit 113 and the current output PMOS transistor MP123A of the output driver unit 114A form a current mirror in which the PMOS transistor MP121 serves as an input transistor. Likewise, when the switch circuit SW121B is ON, the PMOS transistor MP121 of the current generation unit 113 and the current output PMOS transistor MP123B of the output driver unit 114B form a current mirror in which the PMOS transistor MP121 serves as an input transistor.

The decoder 115 receives the voltage pulse signals UP and DN and the selection control signal SEL. The decoder 115 outputs the control signals UP1, UP2, DN1 and DN2 according to the value of the selection control signal SEL. FIG. 3 shows a table showing the relationship of the selection control signal SEL with the control signals UP1, UP2, DN1 and DN2.

Figure 4:
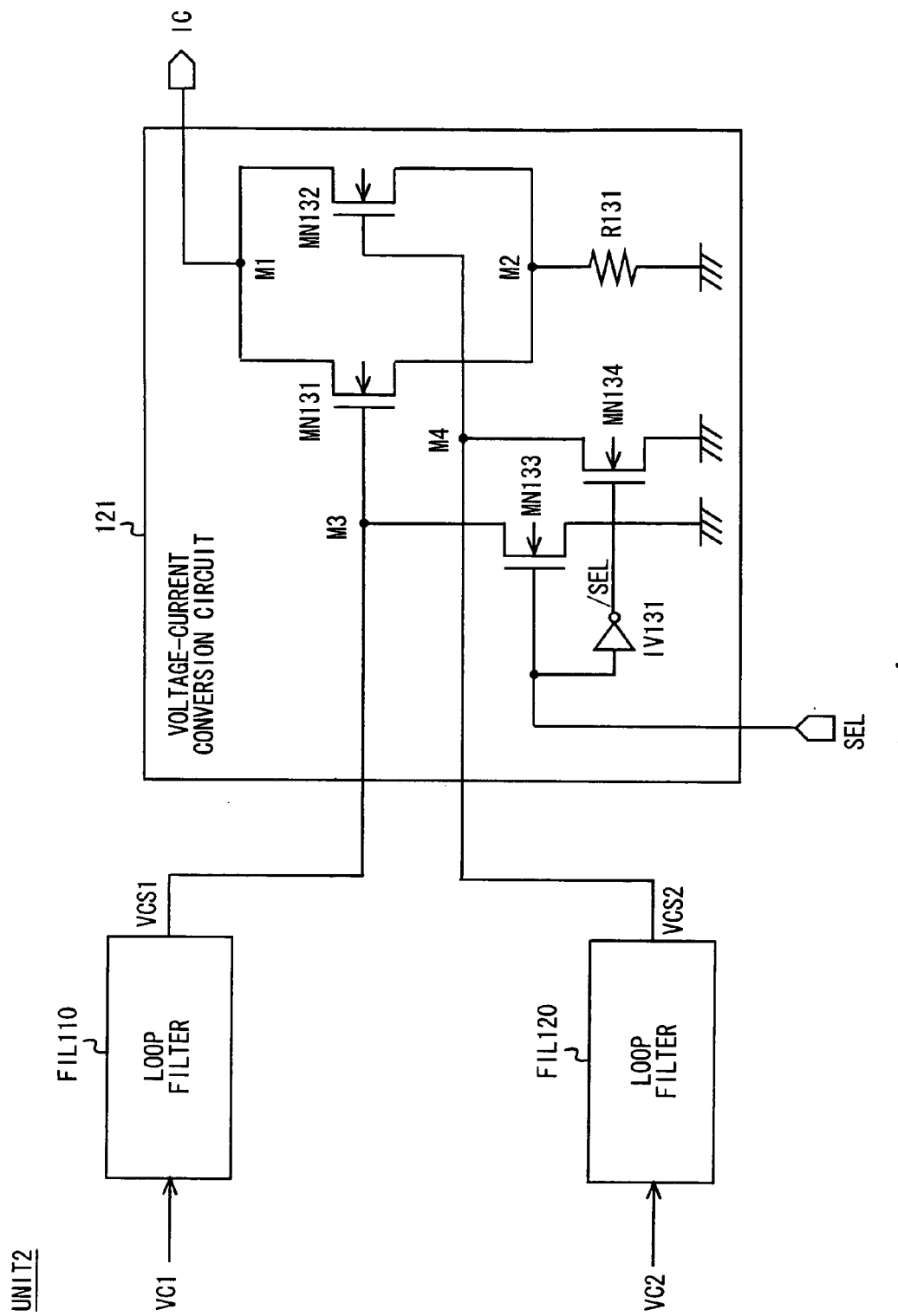
FIG. 4 shows configurations of loop filters and a voltage-current conversion circuit according to an exemplary embodiment.

Hereinafter, the loop filters FIL110 and FIL120 and the voltage-current conversion circuit 121 shown in FIG. 1 are described in detail, referred to as a circuit unit UNIT2. FIG. 4 shows a detailed circuit configuration of the circuit unit UNIT2. Referring to FIG. 4, the voltage-current conversion circuit 121 includes NMOS transistors MN131 and MN132, pull-down NMOS transistors MN133 and MN134, and a resistor R131.

The drain of the NMOS transistor MN131 (seventh transistor) is connected to a node M1, the source is connected to a node M2, and the gate is connected to a node M3. The voltage signal VCS1 from the loop filter FIL110 is applied to the node M3. Thus, the voltage signal VCS1 is input to the gate of the NMOS transistor MN131. The drain of the NMOS transistor MN132 (eighth transistor) is connected to the node M1, the source is connected to the node M2, and the gate is connected to a node M4. The voltage signal VCS2 from the loop filter FIL120 is applied to the node M4. Thus, the voltage signal VCS2 is input to the gate of the NMOS transistor MN132. One end of the resistor R131 is connected to the node M2, and the other end is connected to the ground terminal GND.

The node M1 serves as an output terminal of the voltage-current conversion circuit 121. The conduction state of the NMOS transistor MN131 and the NMOS transistor MN132 is controlled according to the potential of the node M3 and the node M4, respectively. Therefore, the drain current corresponding to the potential of the node M3 or M4 flows to the node M1. The drain current is then output as the current signal IC from the voltage-current conversion circuit 121.

The drain of the pull-down NMOS transistor MN133 is connected to the node M3, and the source is connected to the ground terminal GND. The selection control signal SEL is input to the gate of the pull-down NMOS transistor MN133. The drain of the pull-down NMOS transistor MN134 is connected to the node M4, and the source is connected to the ground terminal GND. An inverted signal /SEL (which is referred to hereinafter as an inverted selection control signal) of the selection control signal SEL is input to the gate of the pull-down NMOS transistor MN134 via an inverter circuit IV131 or the like. The parasitic capacitance generated by the pull-down NMOS transistors MN133 and MN134 is sufficiently smaller with respect to the loop filters FIL110 and FIL120, respectively. Further, measures such as increasing the L size of the pull-down NMOS transistors MN133 and MN134 are taken in order to prevent leakage current.

The operation of the PLL circuit 100 having the above-described configuration is described hereinafter. First, the operation of the charge pump 112 is described on the basis of the table shown in FIG. 3. As shown in the table of FIG. 3, when the value of the selection control signal SEL is "0", the values of the control signals UP2 and DN2 are fixed to "0" (Low level), and the switch circuits SW111B and SW121B turn OFF. Accordingly, the node N2 and the node N3B, and the node N1 and the node N4B are respectively electrically disconnected from each other.

Concurrently, the pull-up PMOS transistor MP122B turns ON because the Low-level control signal UP2 is applied to its gate. Accordingly, the node N3B is pulled up to the power supply voltage VDD, and the current output PMOS transistor MP123B thereby turns OFF. Further, the pull-down NMOS transistor MN112B also turns ON because the High-level control signal /DN2 is applied to its gate. Accordingly, the node N4B is pulled down to the ground voltage GND, and the current output NMOS transistor MN113B thereby turns OFF. Thus, the node N5B becomes high impedance, and the current signal VC2 is not output from the output driver unit 114B.

On the other hand, the control signals UP1 and DN1 become the voltage pulse signals UP and DN, respectively. When the values of the voltage pulse signals UP and DN are "1", a current flows to the current output PMOS transistor MP123A that forms a current mirror with the PMOS transistor MP121 and to the current output NMOS transistor MN113A that forms a current mirror with the NMOS transistor MN111 as described above. Accordingly, a drain current of the current output PMOS transistor MP123A and the current output NMOS transistor MN113A flows according to the control signals UP1 and DN1, and the current signal VC1 is output from the output driver unit 114A.

Further, as shown in the table of FIG. 3, when the value of the selection control signal SEL is "1", the values of the control signals UP1 and DN1 are fixed to "0" (Low level), and the switch circuits SW111A and SW121A turn OFF. Accordingly, the node N1 and the node N3A, and the node N1 and the node N4A are respectively electrically disconnected from each other.

Concurrently, the pull-up PMOS transistor MP122A turns ON because the Low-level control signal UP1 is applied to its gate. Accordingly, the node N3A is pulled up to the power supply voltage VDD, and the current output PMOS transistor MP123A thereby turns OFF. Further, the pull-down NMOS transistor MN112A also turns ON because the High-level control signal /DN1 is applied to its gate. Accordingly, the node N4A is pulled down to the ground voltage GND, and the current output NMOS transistor MN113A thereby turns OFF. Thus, the node NSA becomes high impedance, and the current signal VC1 is not output from the output driver unit 114A.

On the other hand, the control signals UP2 and DN2 become the voltage pulse signals UP and DN, respectively. When the values of the voltage pulse signals UP and DN are "1", a current flows to the current output PMOS transistor MP123B that forms a current mirror with the PMOS transistor MP121 and to the current output NMOS transistor MN113B that forms a current mirror with the NMOS transistor MN111 as described above. Accordingly, a drain current of the current output PMOS transistor MP123B and the current output NMOS transistor MN113B flows according to the control signals UP2 and DN2, and the current signal VC2 is output from the output driver unit 114B.

The operation of the voltage-current conversion circuit 121 is described hereinbelow. As described above, when the value of the selection control signal SEL is "0" (Low level), the current signal VC1 is output from the output driver unit 114A, and the current signal VC2 is not output from the output driver unit 114B. Therefore, when the value of the selection control signal SEL is "0", only the voltage signal VCS1 from the loop filter FIL110 is input to the voltage-current conversion circuit 121. Concurrently, the Low-level selection control signal SEL is input to the gate of the pull-down NMOS transistor MN133. Accordingly, the pull-down NMOS transistor MN133 turns OFF, and the ground terminal GND and the node M3 are electrically disconnected.

On the other hand, the High-level inverted selection control signal /SEL is input to the gate of the pull-down NMOS transistor MN134. Accordingly, the pull-down NMOS transistor MN134 turns ON, and the potential of the node M4 is pulled down to the ground voltage GND, and the NMOS transistor MN132 turns OFF. Therefore, only a drain current of the NMOS transistor MN131 corresponding to the voltage signal VCS1 flows to the node M1. Then, the drain current is output as the current signal IC from the voltage-current conversion circuit 121.

Further, when the value of the selection control signal SEL is "1" (High level), the current signal VC2 is output from the output driver unit 114B, and the current signal VC1 is not output from the output driver unit 114A. Therefore, when the value of the selection control signal SEL is "1", only the voltage signal VCS2 from the loop filter FIL120 is input to the voltage-current conversion circuit 121. Concurrently, the Low-level inverted selection control signal /SEL is input to the gate of the pull-down NMOS transistor MN134. Accordingly, the pull-down NMOS transistor MN134 turns OFF, and the ground terminal GND and the node M4 are electrically disconnected.

On the other hand, the High-level selection control signal SEL is input to the gate of the pull-down NMOS transistor MN133. Accordingly, the pull-down NMOS transistor MN133 turns ON, and the potential of the node M3 is pulled down to the ground voltage GND, and the NMOS transistor MN131 turns OFF. Therefore, only a drain current of the NMOS transistor MN132 corresponding to the voltage signal VCS2 flows to the node M1. Then, the drain current is output as the current signal IC from the voltage-current conversion circuit 121.

As described above, either one of the loop filter FIL110 or FIL120 is selected according to the value of the selection control signal SEL from the control circuit 140. For example, in order to lock up the PLL circuit 100 at high speed, for example, the control circuit 140 selects the loop filter FIL120 with a high cut-off frequency. In this case, the value of the selection control signal SEL from the control circuit 140 is set to "1". When the value of the selection control signal SEL is "1", the current signal VC2 is output from the output driver unit 114B, and the current signal VC1 is not output from the output driver unit 114A as described above.

Thus, the phase frequency detector 110 compares the phases of the reference clock signal FR input from the input terminal IN101 and the feedback clock signal FD output from the frequency divider 130. Then, the current signal VC2 corresponding to the phase difference is converted to the voltage signal VCS2 in the loop filter FIL120. The voltage signal VCS2 is input to the voltage control oscillator 120, and the voltage control oscillator 120 outputs the clock signal OUT with a frequency corresponding to the voltage signal VCS2. The frequency divider 130 divides the frequency of the clock signal OUT and outputs the feedback clock signal FD to the phase frequency detector 110.

On the other hand, in order to reduce the transfer of jitter of a reference signal input to the PLL circuit 100 to an output clock signal, the control circuit 140 selects the loop filter FIL110 with a low cut-off frequency. In this case, the value of the selection control signal SEL from the control circuit 140 is set to "0". When the value of the selection control signal SEL is "0", the current signal VC1 is output from the output driver unit 114A, and the current signal VC2 is not output from the output driver unit 114B as described above. The configuration is the same as that when the value of the selection control signal SEL is "1" except that the loop filter FIL110 is selected, and the operation of the PLL circuit 100 as a whole is not redundantly described.

In the PLL circuit 1 according to prior art, the switch circuits SW10 and SW20 are respectively connected at the input and output sides of the loop filters FIL10 and FIL20. Therefore, the on-resistance and the parasitic capacitance of the switch circuits SW10 and SW20 are connected in series or parallel to a resistor and a capacitor constituting the loop filter FIL10 or FIL20. This causes variation in CR characteristics of the loop filter FIL10 or FIL20, which affects the cut-off frequency and the phase characteristics of the loop filter. Therefore, when the cut-off frequency of the loop filter becomes lower than a desired value, for example, the lock-up time of the PLL circuit 1 is lengthened, thus causing deterioration in characteristics.

However, in the PLL circuit 100 according to the exemplary embodiment, there is no switch like the switch circuit SW10 or SW20 of the PLL circuit 1 that generates the on-resistance and the parasitic capacitance on the input side and the output side with respect to the loop filter FIL110 or FIL120. Therefore, variation in the phase characteristics and the frequency characteristics of the loop filter FIL110 or FIL120 does not occur. It is thereby possible to prevent the deterioration in characteristics of the PLL circuit 100, such as lengthening of the lock-up time.

The present invention is not limited to the above-described exemplary embodiment, and various changes may be made without departing from the scope of the invention. For example, although a cut-off frequency is different between the loop filters FIL110 and FIL120 in the above-described exemplary embodiment, not only a cut-off frequency but also a gain, a dumping factor or the like may be different between the loop filters FIL110 and FIL120. Specifically, the scope of the present invention is to provide a structure capable of suppressing variation in the above-described characteristics of the loop filters by reducing the effect of a parasitic capacitor such as a switch circuit with respect to the input and output sides of a plurality of loop filters.

Further, although the case where the PLL circuit 100 includes two loop filters is described above, three or more loop filters may be included. Note that, however, it is necessary to alter the circuit configurations of the phase frequency detector 110 and the voltage control oscillator 120 according to the number of loop filters.

Figure 5:
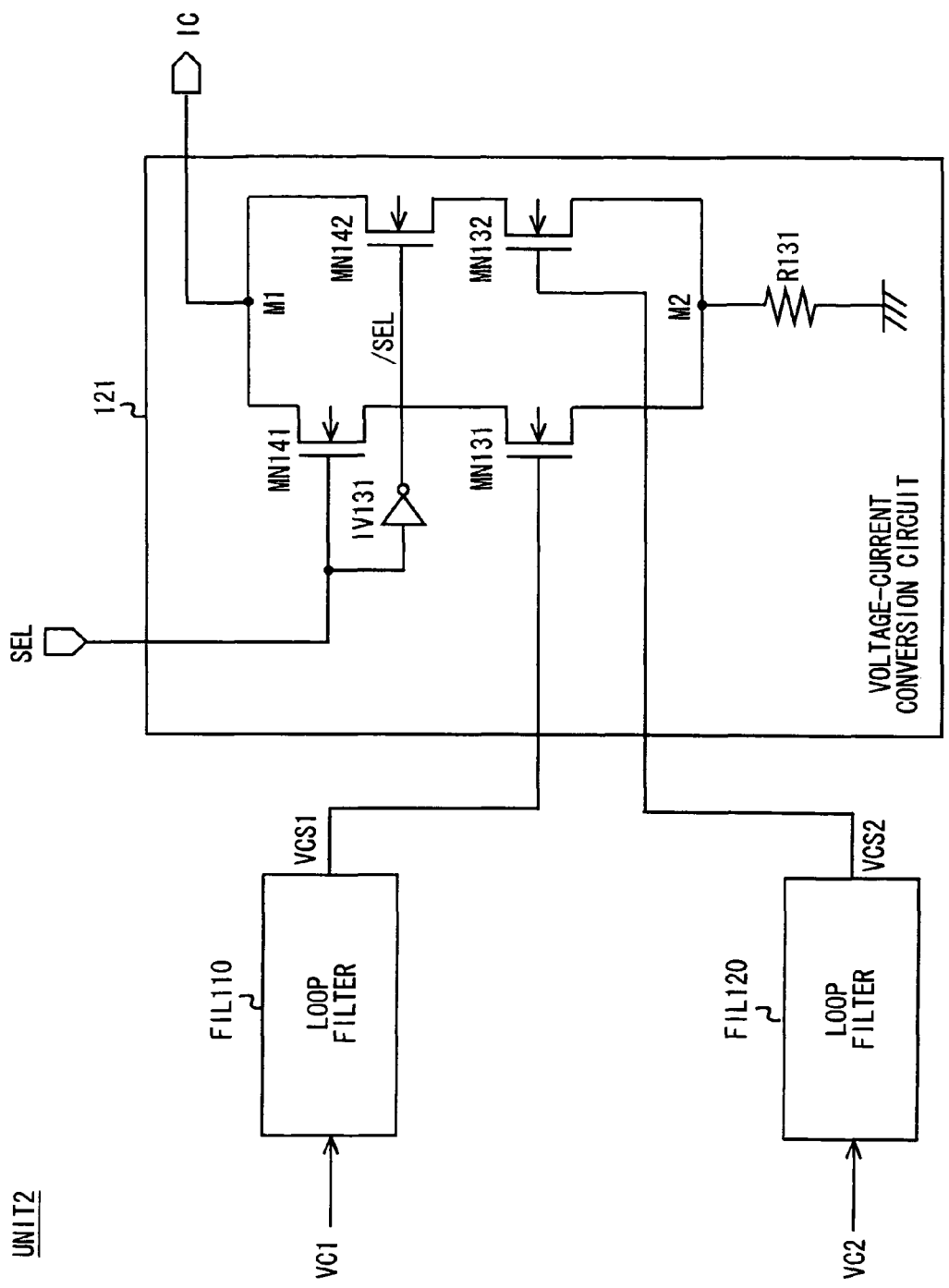
FIG. 5 shows configurations of loop filters and a voltage-current conversion circuit according to an exemplary embodiment.
Figure 6:
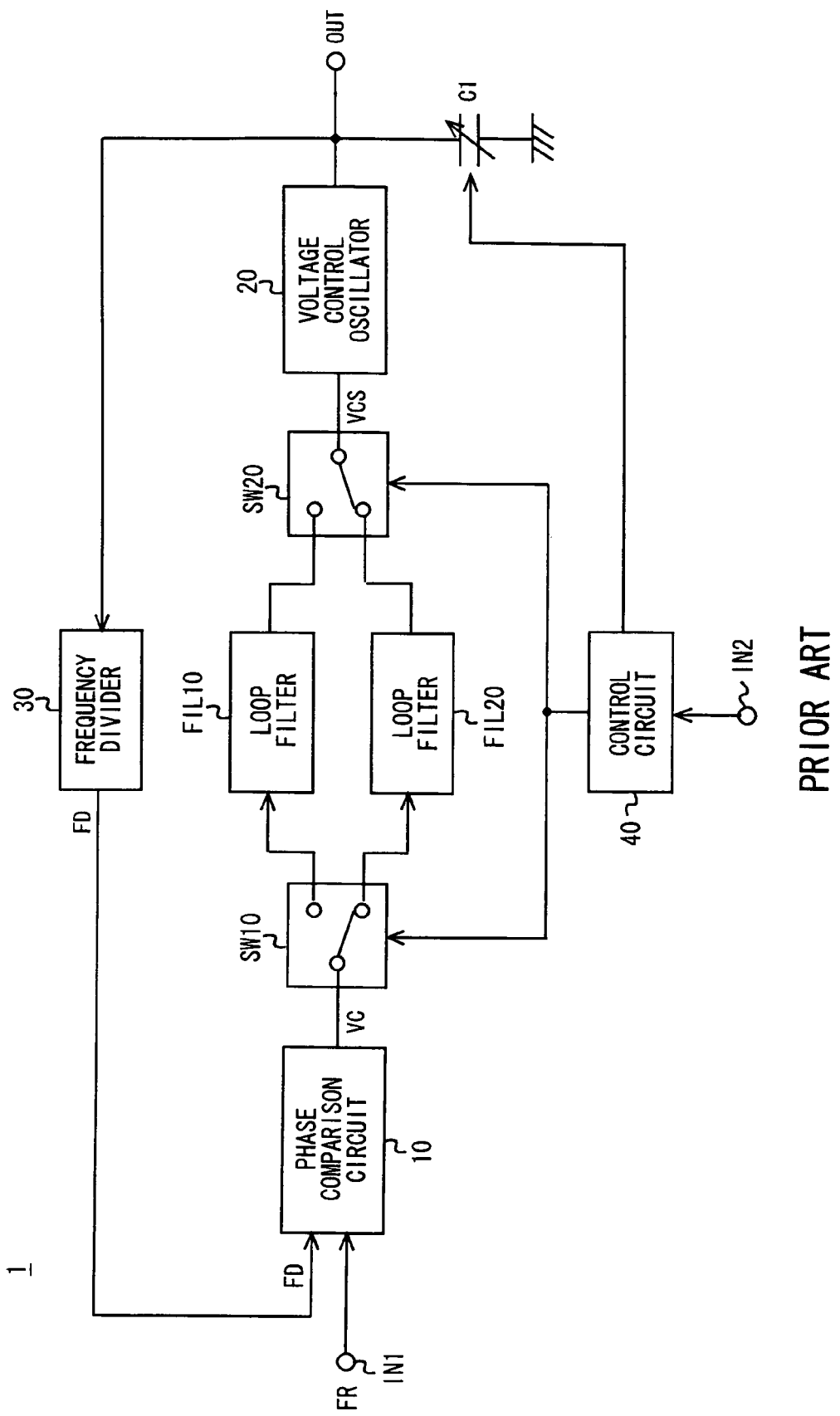
FIG. 6 is a block diagram of a PLL circuit according to prior art.
Figure 7:
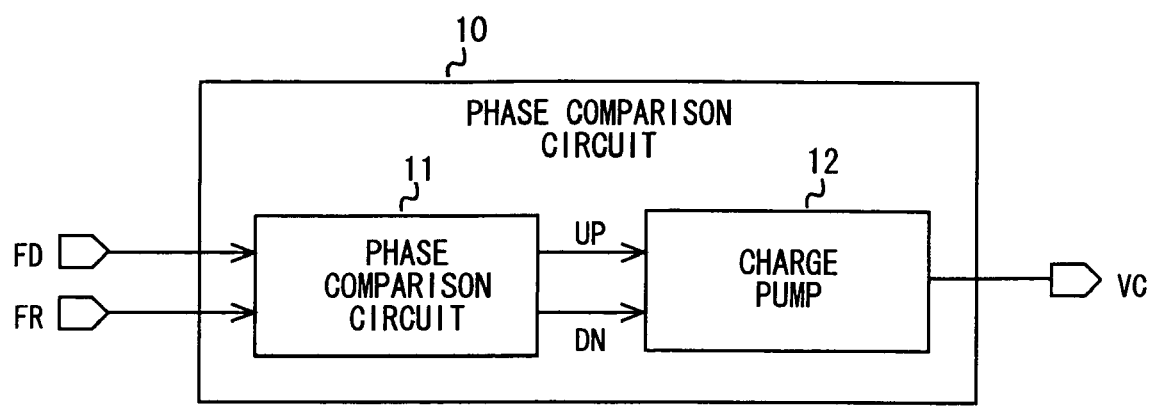
FIG. 7 is a block diagram of a phase frequency detector according to prior art.
Figure 8:
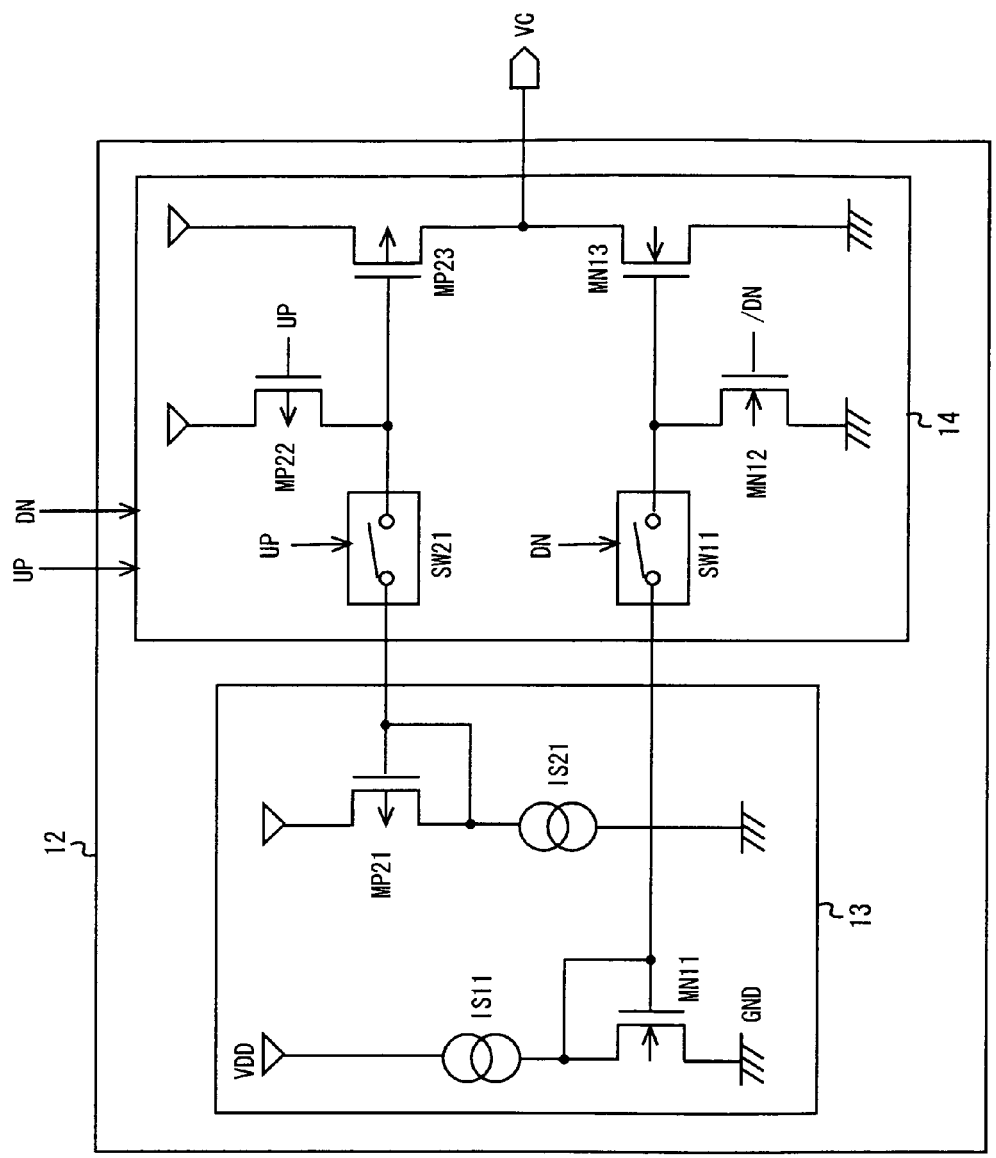
FIG. 8 shows a configuration of a charge pump according to prior art.
Figure 9:
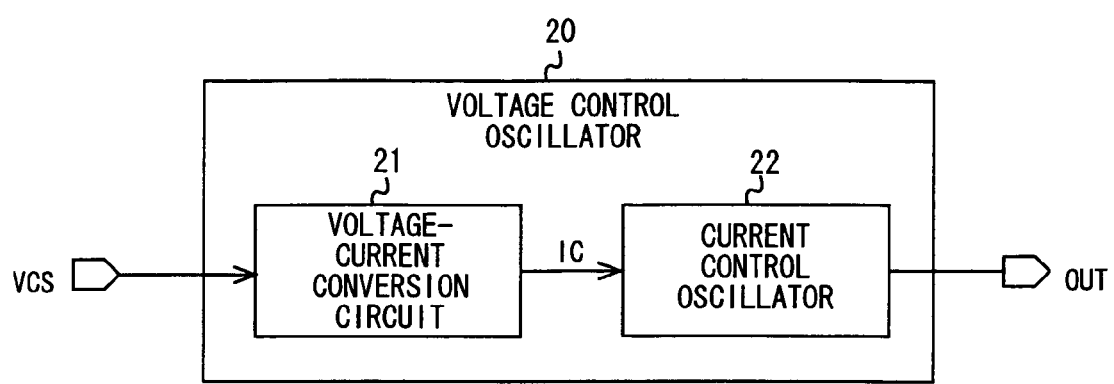
FIG. 9 is a block diagram of a voltage control oscillator according to prior art.
Figure 10:
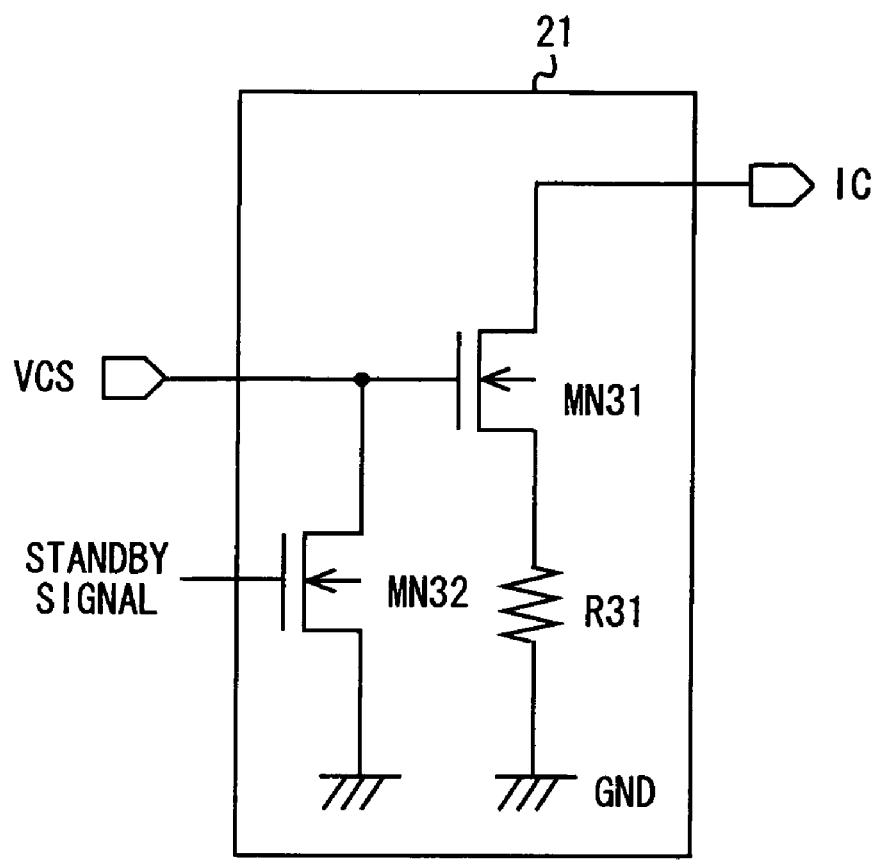
FIG. 10 shows a configuration of a voltage-current conversion circuit according to prior art.

Furthermore, in the case where the parasitic capacitance of the pull-down NMOS transistors MN133 and MN134 still affects the loop filters FIL110 and FIL120, an NMOS transistor MN141 (ninth transistor) and an NMOS transistor MN142 (tenth transistor) may be connected respectively between the NMOS transistor MN131 and the node M1 and between the NMOS transistor MN132 and the node M1 as shown in FIG. 5. This enables reduction of the parasitic capacitance of the pull-down NMOS transistors MN133 and MN134. In this case, however, it is necessary to sufficiently increase the transistor sizes of the NMOS transistors MN141 and MN142 and sufficiently reduce the on-resistance.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A phase-locked loop (PLL) circuit including a first loop filter and a second loop filter, the PLL circuit comprising:
a current signal generation circuit that includes a first output driver that generates a first current signal to be output to the first loop filter and a second output driver that generates a second current signal to be output to the second loop filter; and
a control circuit that selects which of the first output driver and the second output driver is to be activated,
wherein the control circuit outputs a selection control signal,
wherein the current signal generation circuit includes a first switch circuit that activates the first output driver and a second switch circuit that activates the second output driver, and
wherein one of the first switch circuit and the second switch circuit is controlled according to the selection control signal.

2. The PLL circuit according to claim 1, wherein the first output driver includes a first transistor and a second transistor connected in series, and the first current signal is output from a common node of the first transistor and the second transistor, and
wherein the second output driver includes a third transistor and a fourth transistor connected in series, and the second current signal is output from a common node of the third transistor and the fourth transistor.

3. The PLL circuit according to claim 2, wherein the current signal generation circuit includes a first current source, a second current source, a fifth transistor connected to the first current source, and a sixth transistor connected to the second current source,
wherein the first transistor and the third transistor respectively form a current mirror with the sixth transistor serving as an input transistor,
wherein the second transistor and the fourth transistor respectively form a current mirror with the fifth transistor serving as an input transistor,
wherein the first switch circuit is connected between the sixth transistor and the first transistor and between the fifth transistor and the second transistor, and
wherein the second switch circuit is connected between the sixth transistor and the third transistor and between the fifth transistor and the fourth transistor.

4. The PLL circuit according to claim 3, wherein the control circuit turns OFF the second switch circuit, when the first output driver outputs the first current signal, and turns OFF the first switch circuit, when the second output driver outputs the second current signal, each by the selection control signal.

5. The PLL circuit according to claim 1, wherein the first loop filter outputs a first voltage signal corresponding to the first current signal, and the second loop filter outputs a second voltage signal corresponding to the second current signal,
wherein the PLL circuit includes:
a voltage-current conversion circuit that receives the first voltage signal and the second voltage signal; and
a current control oscillation circuit that generates a frequency signal according to a current control signal output from the voltage-current conversion circuit, and
wherein the voltage-current conversion circuit generates the current control signal according to one of the first voltage signal and the second voltage signal.

6. The PLL circuit according to claim 5, wherein the voltage-current conversion circuit includes a seventh transistor and an eighth transistor that generate the current control signal according to the first voltage signal and the second voltage signal, which are respectively input to control terminals of the seventh transistor and the eighth transistor,
wherein the eighth transistor turns OFF according to the selection control signal, when the first voltage signal is input to the control terminal of the seventh transistor, and
wherein the seventh transistor turns OFF according to the selection control signal, when the second voltage signal is input to the control terminal of the eighth transistor.

7. The PLL circuit according to claim 5, wherein the voltage-current conversion circuit includes:
a seventh transistor and an eighth transistor that generate the current control signal according to the first voltage signal and the second voltage signal respectively input to control terminals of the seventh transistor and the eighth transistor;
a ninth transistor that blocks a current flowing to the seventh transistor, when the second voltage signal is input to the control terminal of the eighth transistor; and
a tenth transistor that blocks a current flowing to the eighth transistor, when the first voltage signal is input to the control terminal of the seventh transistor.

8. The PLL circuit according to claim 1, wherein the first output driver includes a first transistor and a second transistor connected in series.

9. The PLL circuit according to claim 1, wherein, when the control circuit activates the first output driver, a frequency characteristic of the first loop filter remains constant.

10. The PLL circuit according to claim 1, wherein, when the control circuit activates the first output driver, a phase characteristic of the first loop filter remains constant.

11. The PLL circuit according to claim 1, wherein, when the control circuit activates the second output driver, the second current signal is output to the second loop filter.

12. The PLL circuit according to claim 11, wherein, when the control circuit activates the first output driver, the first current signal is output to the first loop filter.

13. The PLL circuit according to claim 12, wherein, when the first output driver is activated, the second output driver is de-activated.

14. The PLL circuit according to claim 1, wherein the first loop filter and the second loop filter have different cut-off frequencies.

15. The PLL circuit according to claim 1, wherein, when a cut-off frequency of the second loop filter is below a predetermined value, a lock-up time of the PLL circuit remains constant.

16. The PLL circuit according to claim 1, wherein the PLL circuit further comprises a voltage-current conversion circuit configured to receive a selection signal from the control circuit, to receive one of a first voltage signal from the first loop filter and a second voltage signal from the second loop filter, and to output a current control signal corresponding to the first voltage signal or the second voltage signal based on the selection signal.

17. The PLL circuit according to claim 16, wherein, when the voltage-current conversion circuit receives the first voltage signal, a frequency of the current control signal corresponds to a frequency of the first voltage signal, and when the voltage-current conversion circuit receives the second voltage signal, the frequency the current control signal corresponds to a frequency of the second voltage signal.

18. A phase-locked loop (PLL) circuit comprising:
a control circuit configured to output a selection signal;
a first loop filter;
a second loop filter; and
a current generation circuit configured to receive the selection signal from the control circuit,
wherein, when the selection signal comprises a first value, the current generation circuit outputs a first current signal to the first loop filter, and when the selection signal comprises a second value different than the first value, the current generation circuit outputs a second current signal to the second loop filter.

19. The phase-locked loop circuit according to claim 18, wherein the current generation circuit includes:
a first output driver that generates the first current signal; and
a second output driver that generates the second current signal.

20. The phase-locked loop circuit according to claim 19, wherein the current generation circuit further includes:
a first switch that activates the first output driver; and
a second switch that activates the second output driver.

* * * * *